United States Patent
Son

(10) Patent No.: US 8,093,611 B2
(45) Date of Patent: Jan. 10, 2012

(54) SEMICONDUCTOR LIGHT EMITTING DEVICE AND METHOD OF MANUFACTURING THE SAME

(75) Inventor: Hyo Kun Son, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/451,622

(22) PCT Filed: May 21, 2008

(86) PCT No.: PCT/KR2008/002836
§ 371 (c)(1),
(2), (4) Date: Nov. 20, 2009

(87) PCT Pub. No.: WO2008/143460
PCT Pub. Date: Nov. 27, 2008

(65) Prior Publication Data
US 2010/0133567 A1     Jun. 3, 2010

(30) Foreign Application Priority Data
May 21, 2007  (KR) .......... 10-2007-0049058

(51) Int. Cl.
*H01L 33/02* (2010.01)

(52) U.S. Cl. ............... 257/98; 257/E33.068
(58) Field of Classification Search .......... 257/98, 257/E33.067, E33.068, E33.074; 438/29
See application file for complete search history.

(56) References Cited

U.S. PATENT DOCUMENTS

| | | | |
|---|---|---|---|
| 6,821,804 B2 * | 11/2004 | Thibeault et al. | 438/29 |
| 2005/0173718 A1 * | 8/2005 | Shin | 257/98 |
| 2005/0221521 A1 * | 10/2005 | Lee et al. | 438/29 |
| 2006/0006407 A1 | 1/2006 | Kim et al. | |
| 2006/0157719 A1 | 7/2006 | Kwak et al. | |
| 2008/0191195 A1 | 8/2008 | Tanizawa et al. | |
| 2009/0309118 A1 * | 12/2009 | Song | 257/99 |

FOREIGN PATENT DOCUMENTS

| | | |
|---|---|---|
| CN | 1292934 A1 | 4/2001 |
| KR | 10-2006-0038756 A | 5/2006 |

* cited by examiner

*Primary Examiner* — Wensing Kuo
(74) *Attorney, Agent, or Firm* — Birch, Stewart, Kolasch & Birch, LLP

(57) ABSTRACT

A semiconductor light emitting device and a method of manufacturing the same are provided. The semiconductor light emitting device comprises a first conductive semiconductor layer comprising a concave portion, an active layer on the first conductive semiconductor layer, and a second conductive semiconductor layer on the active layer.

18 Claims, 4 Drawing Sheets

[Fig. 1]
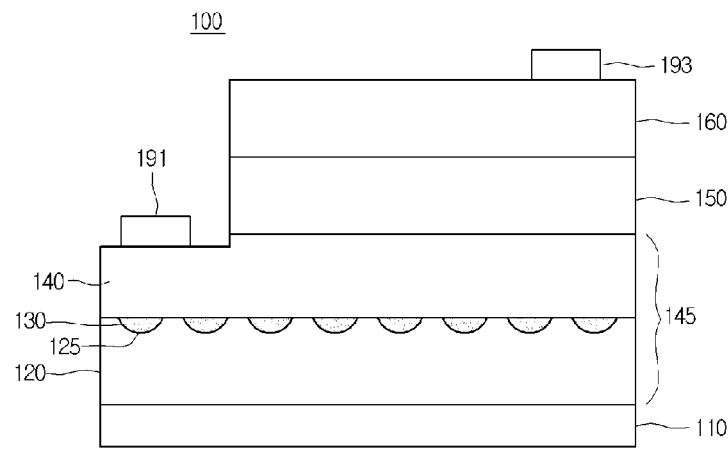
[Fig. 2]
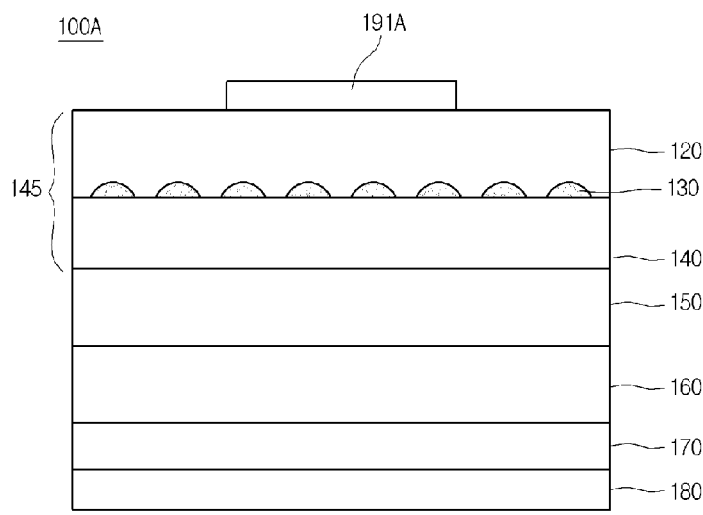
[Fig. 3]
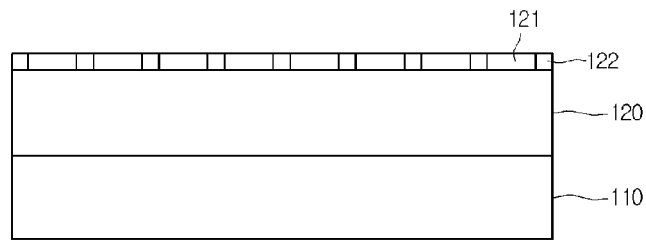
[Fig. 4]
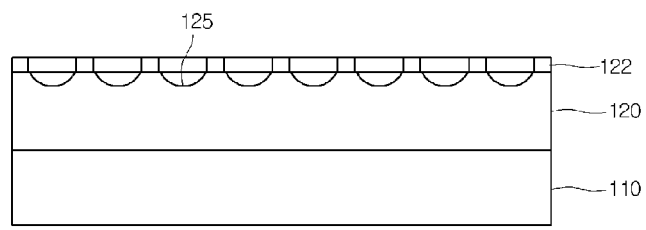

[Fig. 5]
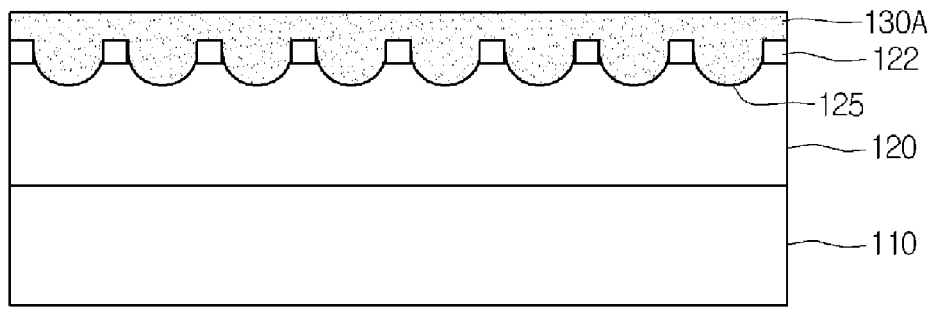
[Fig. 6]
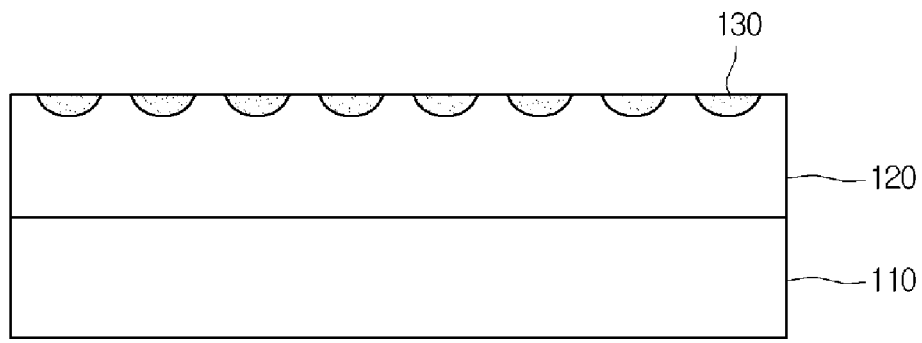
[Fig. 7]
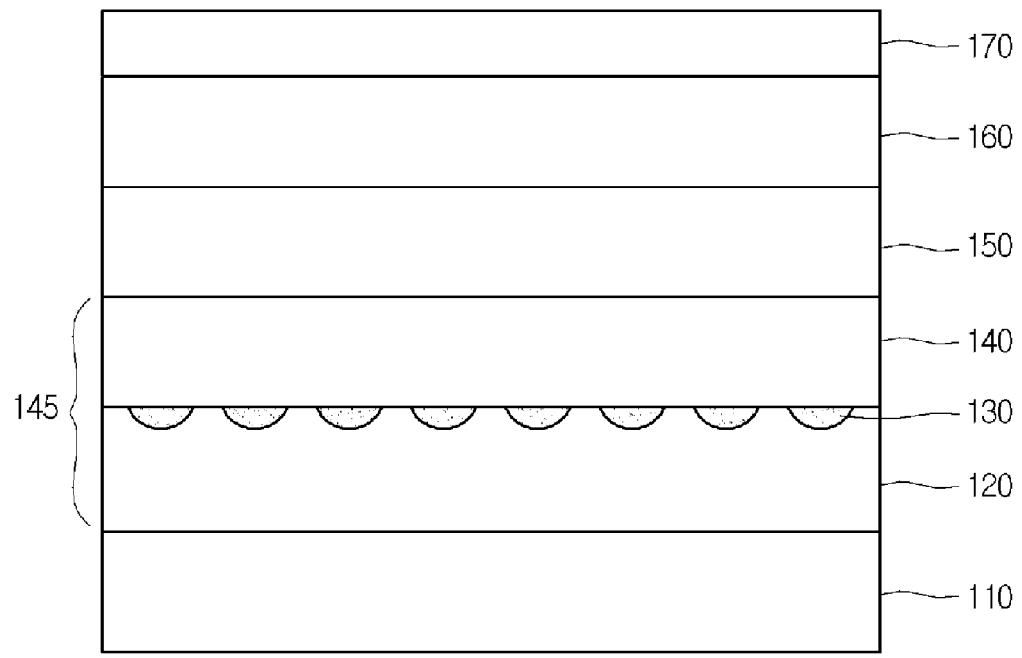

[Fig. 8]
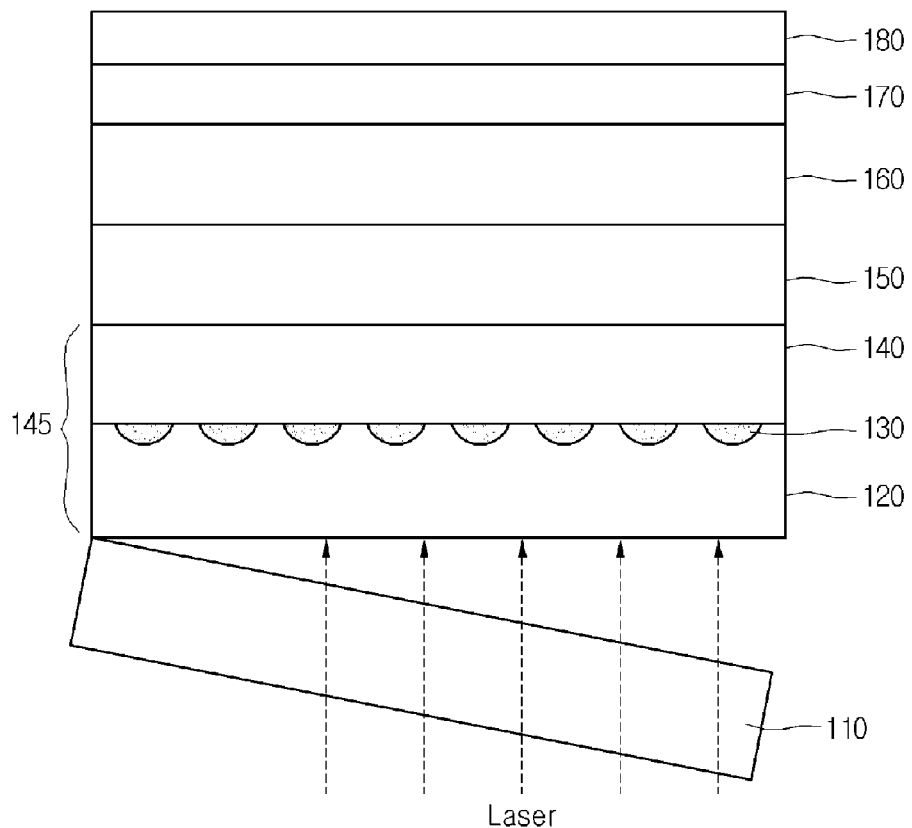
[Fig. 9]
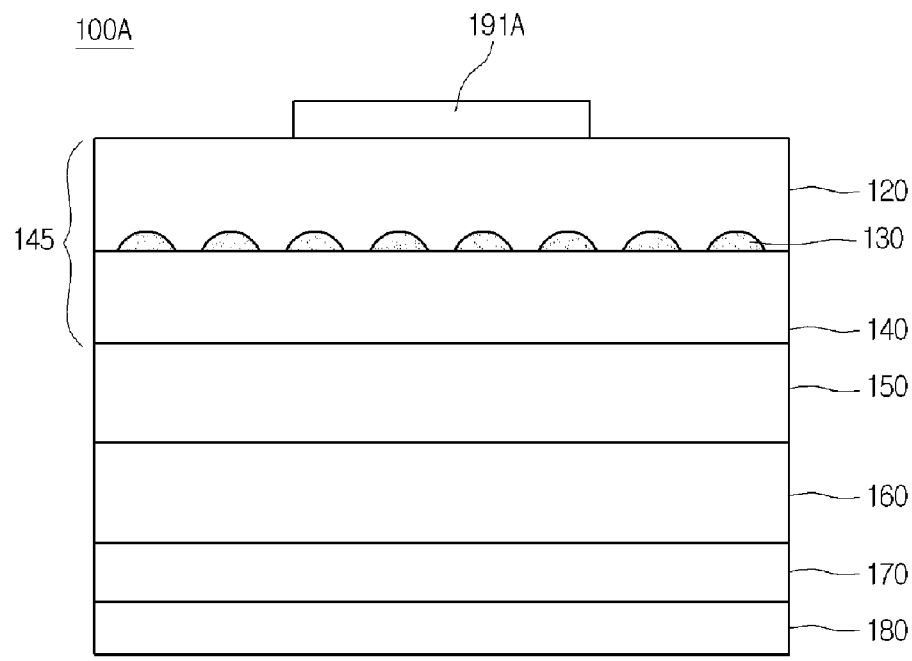

[Fig. 10]
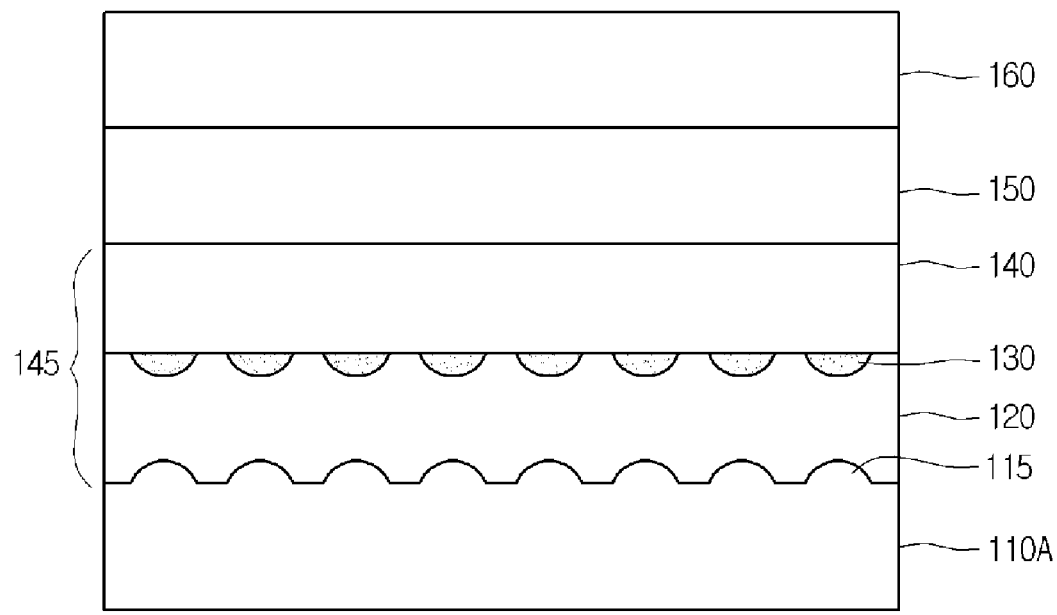

US 8,093,611 B2

SEMICONDUCTOR LIGHT EMITTING DEVICE AND METHOD OF MANUFACTURING THE SAME

TECHNICAL FIELD

The embodiment relates to a semiconductor light emitting device and a method of manufacturing the same.

BACKGROUND ART

Light emitting diodes (LEDs) are designed to emit light with a variety of colors using compound semiconductor materials such as a GaAs-based material, AlGaAs-based material, a GaN-based material, an InGaN-based material, an InGaAlP-based material, and the like. The LEDs are packaged and used as light sources for a variety of devices such as lighting devices, character display devices, and image display devices.

The light emitting diode comprises an N-type semiconductor layer, an active layer, and a P-type semiconductor layer, that are stacked on one another. When electric power is applied, light is generated by the active layer and emitted to an external side.

DISCLOSURE OF INVENTION

Technical Problem

Embodiments provide a semiconductor light emitting device that is configured to improve external light extracting efficiency by forming a plurality of concave structures on a semiconductor layer on or under an active layer and a method of manufacturing the semiconductor light emitting device.

Embodiments provide a semiconductor light emitting device that is designed to improve external light extraction efficiency by forming a concave structure on a semi-conductor layer corresponding to a convex portion of a substrate.

Technical Solution

An embodiment provides a semiconductor light emitting device comprising: a first conductive semiconductor layer comprising a concave or convex portion; an active layer on the first conductive semiconductor layer; and a second conductive semi-conductor layer on the active layer.

An embodiment provides a semiconductor light emitting device comprising: a plurality of n-type semiconductor layers; a plurality of concave or convex lens portions formed between the n-type semiconductor layers; an active layer on the n-type semi-conductor layers; and at least one conductive semiconductor layer on the active layer.

An embodiment provides a method of manufacturing a semiconductor light emitting device comprising: forming a 1n-type nitride layer; forming a concave or convex lens portion on a surface of the 1n-type nitride layer; forming a 2n-type nitride layer on the 1n-type nitride layer; forming an active layer on the 2n-type nitride layer; and forming at least one conductive semiconductor layer on the active layer.

Advantageous Effects

Embodiments can improve external light extracting efficiency.

Embodiments can improve quantum efficiency without deteriorating electrical properties such as increase of an operational voltage of a semiconductor light emitting device and increase of leakage current.

BRIEF DESCRIPTION OF THE DRAWINGS

FIG. 1 is a side sectional view of a semiconductor light emitting device according to a first embodiment.

FIG. 2 is a side sectional view of a semiconductor light emitting device according to a second embodiment.

FIGS. 3 to 9 are views illustrating a manufacturing process of the semiconductor light emitting device according to the second embodiment.

FIG. 10 is a side sectional view of a semiconductor light emitting device according to a third embodiment.

BEST MODE FOR CARRYING OUT THE INVENTION

Reference will now be made in detail to the embodiments, examples of which are illustrated in the accompanying drawings. In the following description, it will be understood that when a layer is referred to as being 'on' or "under" another layer, the words 'on' and "under" are based on the drawings. In addition, thicknesses of layers are exemplarily illustrated in the drawing and this not limited thereto.

FIG. 1 is a side sectional view of a semiconductor light emitting device according to a first embodiment.

Referring to FIG. 1, a semiconductor light emitting device 100 comprises a substrate 110, a first conductive semiconductor layer 145, concave portions 130, an active layer 150, a second conductive semiconductor layer 160, a first electrode 191, and a second electrode 193.

The substrate 110 may be selected from the group consisting of an $Al_2O_3$ substrate, a GaN substrate, a SiC substrate, a ZnO substrate, a Si substrate, a GaP substrate, a GaAs substrate, and a conductive substrate containing metal.

At least one of a buffer layer (not shown), an undoped semiconductor layer (not shown), and the first conductive layer 145 may be formed on the substrate 110. The buffer layer is provided to reduce a lattice constant difference from the substrate 145 and is formed of GaN, AlN, AlGaN, InGaN, AlInN, InN, AlInGaN, or a combination thereof. However, the present disclosure is not limited to this. In addition, the undoped semiconductor layer (not shown) may be a GaN layer formed on the substrate 110 or the buffer layer.

The buffer layer and the first conductive semiconductor layer 145 may be sequentially formed on the substrate 110. Alternatively, the undoped semiconductor layer and the first conductive semiconductor layer 145 may be sequentially formed on the substrate 110. Alternatively, the buffer layer, the undoped semiconductor layer, and the first conductive semiconductor layer 145 may be sequentially formed on the substrate 110. Alternatively, only the first conductive semiconductor layer 145 may be formed on the substrate 110.

The first conductive semiconductor layer 145 may comprise a plurality of n-type nitride layer. Each of the n-type nitride layers may be formed of a material selected from the group consisting of GaN, AlGaN, InGaN, InN, AlN, AlInGaN, and AlInN. First conductive dopants such as Si, Ge, Sn, Se, and Te are doped in the first conductive semiconductor layer 145. Here, the first conductive semiconductor layer 145 comprises first and second nitride layer 120 and 140. The first nitride layer 120 may be formed on the substrate 110 and the second nitride layer 140 may be formed on the first nitride layer 120.

The first and second nitride layer 120 and 140 may be formed of the same or different materials. For example, the first and second nitride layer 120 and 140 may be formed on one of GaN, AlGaN, InGaN, InN, AlN, AlInN, and AlInGaN.

At least one concave portions 130 are formed on the first nitride layer 120. In addition, the concave portion 130 may be formed of a conductive or non-conductive material. For example, the concave portion 130 may be formed of a material selected from the group consisting of $SiO_2$, ITO (Indium Tin Oxide), $Al_2O_3$, and Si. In here, the concave portion 130 may be replaced a convex portion type.

The concave portions 130 may be formed in a hemispherical shape having a predetermined curvature. For example, the concave portions 130 may have a side section formed in one of a hemispherical shape, a concave lens shape, a polygonal shape, an irregular shape, and a pipe shape. The concave portions 130 may be, when viewed from a top, formed in a circular shape, a polygonal shape, or an irregular shape. Alternatively, the concave portions may be formed in a cylindrical shape extending in a vertical and/or horizontal direction. At this point, at least two adjacent concave portions may be formed to extend in the vertical and horizontal directions, respectively. The hemispherical concave portions 130 may be arranged in a systematic pattern such as a matrix pattern or in an irregular pattern.

The concave portions 130 are formed in a shape obtained by partly cutting a sphere. The concave portions 130 formed on a surface of the first nitride layer 120 may be formed in the same size as each other. However, the present disclosure is not limited to this configuration. Alternatively, the hemispherical concave portions 130 may be slightly different in a curvature from each other.

Also, the concave portion 130 may be continuously formed by contacting an adjacent concave portion. However, the present disclosure is not limited to this configuration.

The concave portions 130 may have a depth of, for example, 0.01-50 μm and a diameter of, for example, 0.01-1000 μm. At this point, an optimal depth or diameter of the concave portions 130 may be about 1-3 μm and a distance between the concave portions 130 may be about 0.001-1000 μm. An optimal distance between the concave portions 130 is about 1 μM. The size of the concave portions and the distance between the concave portions may vary depending on a size of the device.

In addition, the first nitride layer 120 is a low refractive index layer and the second nitride layer has the higher refractive index than the first nitride layer 120. For example, the first nitride layer 120 may have a refractive index of 2.12-2.44 and the second nitride layer 140 may have a refractive index of 2.44. Here, the refractive index is measured when a wavelength of the light is 450 nm.

The first nitride layer 120 may contain Al while the second nitride layer 130 may not contain Al. For example, the rust nitride layer 120 may be formed of AlGan and AlN. The second nitride layer 140 may be formed of GaN and InGaN. Alternatively, both the rust and second nitride layers 120 and 140 may comprise Al. At this point, an amount of Al contained in the first nitride layer 120 may be greater than that contained in the second nitride layer 140.

The first nitride layer 120 has a thickness of 1-100 μm that is at least thicker than the concave portion 130. For example, an optimal thickness of the first nitride layer 120 is about 4 μm. The second nitride layer 140 may have a thickness of, for example, 1-100 μm. An optimal thickness of the second nitride layer 140 is about 2 μm. A thickness of the second nitride layer 140 may be determined such that the electrical property is not deteriorated and the second nitride layer 140 grown on the concave portions 130 can be planarized.

If the first and second nitride layers 120 and 140 are n-type GaN layer, the first and second nitride layers 120 and 140 have the following growing conditions. In the n-type GaN layer, trimethyl gallium (TMGa) or triethyl gallium (TEGa) may be used as source gas for Ga and ammonia ($NH_3$), monomethyl-hydrazine (MMHy), or dimethyl-hydrazine (DMHy) may be used as source gas for N. In addition, silane gas may be used as source gas for Si. For example, the GaN layer may be formed by supplying $3.7 \times 10^{-2}$ mole/minute of $NH_3$, $1.2 \times 10^{-4}$ mole/minute of TMGa, and $6.3 \times 10^{-9}$ mole/minute of silane gas. These conditions may vary depending on a thickness of a layer grown.

A surface of the concave portion may be formed on the same plan as the first nitride layer 120 to prevent the electrical property from being deteriorated as the second nitride layer 130 is grown. In addition, the concave portion 130 may be formed of a conductive layer (e.g., ITO) rater than a non-conductive layer (e.g., $SiO_2$) to prevent the operation voltage of the device from increasing by the concave portion 130.

The active layer 150 is formed on the second nitride layer 140 of the first conductive semiconductor layer 145. The active layer 150 may be formed in a single or multiple quantum well structure. For example, the active layer 150 may be formed in the single or multiple quantum well structure comprising a cycle of InGaN well layer/GaN barrier layer. However, the present disclosure is not limited to this.

The second conductive semiconductor layer 160 is formed on the active layer 150. The second conductive semiconductor layer 160 may comprise at least on p-type semi-conductor layer doped with second conductive dopants. The p-type semiconductor layer may be formed of one of GaN, AlGaN, InGaN, InN, AlN, AlInN, and AlInGaN.

An n-type semiconductor layer or/and a transparent electrode may be formed on the second conductive semiconductor layer 160. That is, the transparent electrode may be formed on the second conductive semiconductor layer 160 or the n-type semiconductor layer.

A portion above a top surface of the second nitride layer 140 of the first conductive semiconductor layer 145 at a partial region of the second conductive semiconductor region 160 may be etched through a Mesa etching process, after which the first electrode 191 may be formed on the second nitride layer 140. Subsequently, the second electrode 193 may be formed on the second conductive semiconductor layer 160.

In the above-described semiconductor light emitting device 100, the first and second electrodes 191 and 193 may be bonded through a flip method. For example, when the semiconductor light emitting device 100 is used in the form of a flip chip, the concave portion 130 formed in the first conductive semiconductor layer 145 is arranged in the form of a convex lens type with respect to the active layer 150. The light generated by the active layer 150 passes through the concave portion 130 and the concave portion 130 converges the light, thereby improving the external light efficiency.

FIG. 2 is a side sectional view of a semiconductor light emitting device according to a second embodiment. In the first and second embodiments, like reference numbers will be used to refer to like parts. The description of the like parts will be omitted herein. In addition, properties of the second embodiment for the like parts may not be same as the first embodiment.

Referring to FIG. 2, a semiconductor light emitting device 100A comprises a first conductive semiconductor layer 145 comprising first and second nitride layers 120 and 140, at least one concave portion 130, an active layer 150, a second conductive semi-conductor layer 160, a reflective electrode layer 170, a conductive supporting member 180, and a first electrode 191A.

The first electrode 191A is formed on the first nitride layer 120. The first electrode 191A comprises at least one of Ti, Al, In, Ta, Pd, Co, Ni, Si, Ge, Ag, and Au. The first electrode 191A may be formed with at least one layer.

The reflective electrode layer 170 is formed under the second conductive semi-conductor layer 160 and ohmic-contacts the second conductive semiconductor layer 160 to serve as a second electrode layer. The reflective electrode layer 170 may be formed of a material selected from the group consisting of Ag, Ni, Al, Rh, Pd, Ir, Ru, Mg, Zn, Pt, Au, Hf, and a combination thereof. The reflective electrode layer 170 is formed with at least one layer.

The conductive supporting member 180 is formed under the reflective electrode layer 170. The conductive supporting member 180 may be formed of copper, gold or a conductive substrate containing metal. For example, the conductive supporting member 180 may be formed by plating copper or through a bonding technology. However, the present disclosure is not limited to this. The conductive supporting member 180 is disposed on a base. In addition, due to the property of the metal, the conductive supporting member 180 has higher thermal and electrical conductivities and this it is very effective in manufacturing and driving the devices.

Here, when the conductive supporting member 180 is mounted on a submount, the concave portion 130 formed in the first conductive semiconductor layer 140 is arranged in the form of a convex lens, the external light emitting efficiency for the light generated by the active layer 150 can be improved.

The semiconductor light emitting device 100A may be formed by a junction structure of pn, np, npn, and pnp. The concave portion 130 may be formed in one of a plurality of n-type semiconductor layers or in one of a plurality of p-type semiconductor layers.

FIGS. 3 to 9 are views illustrating a manufacturing process of the semiconductor light emission device according to the second embodiment of the present disclosure.

Referring to FIGS. 3 and 4, the first nitride layer 120 of the first conductive semi-conductor layer is formed on the substrate 110. The substrate 110 may be selected from the group consisting of an $Al_2O_3$ substrate, a GaN substrate, a SiC substrate, a ZnO substrate, a Si substrate, a GaP substrate, a GaAs substrate.

The buffer layer (not shown) and/or the undoped semiconductor layer (not shown) may be formed between the substrate 110 and the first nitride layer 120. The buffer layer and the undoped layer may be removed after growing.

The first nitride layer 120 is the n-type semiconductor layer that may be formed may be formed on one of GaN, AlGaN, InGaN, InN, AlN, AlInN, and AlInGaN. The first conductive dopants such as Si, Ge, Sn, Se, and Te may be doped in the first conductive semiconductor layer 145. The first nitride layer may have a thickness of 1-100 μm, preferably 4 μm.

A mask layer (not shown) is formed on the first nitride layer 120. A desired mask pattern 122 is formed by processing the mask layer through a photoresist process. A shape of a concave portion 121 of the mask pattern 122 may be formed in a circular shape, a polygonal shape, or an elongated shape extending in a vertical or perpendicular direction.

When the first nitride layer 120 is etched through the concave portion 121 of the mask pattern 122, a hemispherical groove 125 formed on the first nitride layer 120. Here, the etching of the first nitride layer 120 may be performed through a dry-etching process or a wet-etching process.

The dry-etching process may be performed by selectively using equipment such as inductively coupled plasma (ICP) apparatus, a reactive ion etching (RIE) apparatus, a capacitively coupled plasma (CCP) apparatus, and/or an electron cyclotron resonance (ECR) apparatus. However, the present disclosure is not limited to this. In addition, the wet-etching process may be performed by selectively using sulfuric acid and/or phosphoric acid. However, the present disclosure is not limited to this.

Referring to FIG. 5, when the spherical groove 125 is formed on a top surface of the first nitride layer 120, a concave layer 130A is formed in the hemispherical groove 125. The concave layer 130A may be formed of a conductive or non-conductive material. For example, the concave portion 130 may be formed of a material selected from the group consisting of $SiO_2$, ITO (Indium Tin Oxide), $Al_2O_3$, and Si. The concave layer 130A may be formed by a sputtering apparatus, an electron-beam apparatus, and/or a metal organic chemical vapor deposition apparatus. However, the present disclosure is not limited to this.

Referring to FIGS. 5 and 6, by etching from the top surface of the concave layer 130A, the hemispherical shape remains. The concave layer 130A is etched by a predetermined thickness through a wet-etching or/and dry-etching process so as to expose the first nitride layer 120 and the concave portion 130. Therefore, the concave portion 130 is formed at the same plan as the first nitride layer 120 and this the hemispherical concave portion 130 formed in a lens type is formed in the hemispherical groove of the first nitride layer 120. At this point, a surface of the concave portion 130 may be formed in a circular shape, a polygonal shape, an irregular shape, or/and an elongated shape extending in a vertical or horizontal direction.

Here, The concave portions 130 may have a depth of 0.01-50 μm and a diameter of 0.01-1000 μm. At this point, an optimal depth or diameter of the concave portions 130 may be about 1-3 μm and a distance between the concave portions 130 may be about 0.001-1000 μm. An optimal distance between the concave portions 130 is about 1 μm. The size of the concave portions and the distance between the concave portions may vary depending on a size of the device.

Referring to FIG. 7, the second nitride layer 140 is formed on the first nitride layer 120. The second nitride layer 140 is formed on the first nitride layer 120 and the concave portion 130 with a predetermined thickness.

The second nitride layer 140 is the n-type semiconductor layer that may be formed of a material selected from the group consisting of GaN, AlGaN, InGaN, InN, AlN, AlInGaN, and AlInN. First conductive dopants such as Si, Ge, Sn, Se, and Te are selectively doped in the second nitride layer 140. The second nitride layer 143 may have a thickness of 1-100 μm, preferably, 2 μm.

The active layer 150 is formed on the second nitride layer 140 of the first conductive semiconductor layer 145. The active layer 150 may be formed in a single or multiple quantum well structure. The second conductive semiconductor layer 160 is formed on the active layer 150. The second conductive semiconductor layer 160 may comprise at least on p-type semiconductor layer doped with second conductive dopants. The p-type semiconductor layer may be formed of one of GaN, AlGaN, InGaN, InN, AlN, AlInN, and AlInGaN. In addition, an n-type semiconductor layer may be formed on the second conductive semiconductor layer 160.

The reflective electrode layer 170 is formed on the second conductive semiconductor layer 160. The reflective electrode layer 170 ohmic-contacts the second conductive semiconductor layer 160 to function as the second electrode. The reflective electrode layer 170 may be formed of a material selected from the group consisting of Ag, Ni, Al, Rh, Pd, Ir, Ru, Mg, Zn, Pt, Au, Hf, and a combination thereof. The reflective electrode layer 170 is formed with at least one layer.

Referring to FIG. 8, the conductive supporting member 180 is formed on the reflective electrode layer 170. The conductive supporting member 180 may be formed of copper, gold or a conductive substrate containing metal. For example, the conductive supporting member 180 may be formed by plating copper or through a bonding technology. The conductive supporting member 180 may be define the uppermost layer of the semiconductor device.

The substrate 110 disposed under the first nitride layer 120 is removed through a physical or chemical process. As the physical process, a laser lift off (LLO) process for irradiating laser having a predetermined wavelength to the surface of the substrate 110 is used. As the chemical process, an etching process using etchant is used to remove a portion between the first substrate 110 and the first nitride layer 120.

Referring to FIG. 9, the conductive supporting member 180 is disposed on the base, after which the first electrode 191A is formed on the first nitride layer 120. At this point, the conductive supporting member 180 is mounted on the submount, the concave portion 130 is arranged in the form of the convex lens on the active layer 150. Therefore, the light is converged and emitted, thereby improving the external light emitting efficiency.

FIG. 10 is a side sectional view of a semiconductor light emitting device according to a third embodiment. In the first and third embodiments, like reference numbers will be used to refer to like parts. The description of the like parts will be omitted herein.

Referring to FIG. 10, a semiconductor device 100B comprises at least one convex portion 115 formed on a substrate 110A. The substrate 110A may be selected from the group consisting of an $Al_2O_3$ substrate, a GaN substrate, a SiC substrate, a ZnO substrate, a Si substrate, a GaP substrate, a GaAs substrate, and a conductive substrate containing metal. The convex portion 115 may be formed in a hemispherical lens shape or a stripe shape through RIE. The hemispherical lens shape is a shape obtained by partly cutting a sphere. The convex portions 115 may be formed with the same or different sizes. The convex portions 115 may be formed with different curvatures. The convex portions 115 may be arranged in a systematic pattern such as a matrix pattern or in an irregular pattern.

Since the semiconductor light emitting device 100B further comprises at least one concave portion 130 on the first nitride layer 120 of the first conductive semiconductor layer 145. Therefore, the concave portion 130 together with the convex portion 115 improves the external extraction efficiency of the light.

Alternatively, the convex portions 115 may be replaced with concave portion on the substrate 100A. In this case, the concave portions on the substrate 110A together with the concave portions on the first nitride layer 120 improve the light efficiency. The light may be diverged by the convex portions on the substrate 100A and is converged by the concave portions.

In the above description, it will be understood that when a layer (or film) is referred to as being 'on' another layer or substrate, it can be directly on the other layer or substrate, or intervening layers may also be present. Further, it will be understood that when a layer is referred to as being 'under' another layer, it can be directly under the other layer, and one or more intervening layers may also be present. In addition, it will also be understood that when a layer is referred to as being 'between' two layers, it can be the only layer between the two layers, or one or more intervening layers may also be present.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

Embodiments can improve external light extracting efficiency.

Embodiments can improve quantum efficiency without deteriorating electrical properties such as increase of an operational voltage of a semiconductor light emitting device and increase of leakage current.

The invention claimed is:

1. A semiconductor light emitting device, comprising:
   a first conductive semiconductor layer comprising a concave or convex portion;
   an active layer on the first conductive semiconductor layer; and
   a second conductive semiconductor layer on the active layer;
   wherein the first conductive semiconductor layer comprises:
      a second nitride-based semiconductor layer under the active layer, and
      a first nitride-based semiconductor layer comprising the concave or convex portion under the second nitride-based semiconductor layer,
   wherein the second nitride-based semiconductor layer has a different material than the first nitride-based semiconductor layer which contains an aluminum (Al) material, and
   wherein the first nitride-based semiconductor layer has a refractive index less than that of the second nitride-based semiconductor layer.

2. The semiconductor light emitting device according to claim 1, wherein the concave or convex portion is formed in a lens shape or a hemispherical shape having a predetermined curvature.

3. The semiconductor light emitting device according to claim 1, wherein a section of the concave or convex portion is formed in one of a circular shape, a polygonal shape, an irregular shape, and a pipe shape.

4. The semiconductor light emitting device according to claim 1, wherein the concave or convex portion is disposed with a predetermined depth from a top surface of the first nitride-based semiconductor layer.

5. The semiconductor light emitting device according to claim 1, further comprising:
   at least one of an undoped layer, a buffer layer, and a substrate disposed under the first conductive semiconductor layer; and
   at least one of an n-type semiconductor layer, a transparent electrode, and a second electrode disposed on the second conductive semiconductor layer.

6. The semiconductor light emitting device according to claim 1,
Wherein each of the first and second nitride-based semiconductor layers includes an n-type semiconductor layer, and
wherein at least one concave or convex portion is formed on a boundary surface of the n-type semiconductor layer.

7. The semiconductor light emitting device according to claim 1, further comprising:
a first electrode directly contacted with a lower surface of the first conductive semiconductor layer;
a reflective electrode layer on the second conductive semiconductor layer; and
a conductive supporting member on the reflective electrode layer.

8. The semiconductor light emitting device according to claim 1, wherein the concave or convex portion comprises a conductive or non-conductive material.

9. The semiconductor light emitting device according to claim 1, further comprising:
a first electrode on the first conductive semiconductor layer; and
a second electrode on the second conductive semiconductor layer,
wherein the second nitride-based semiconductor layer includes a stepped structure having a second top surface stepped lower than a first top surface thereof,
wherein the first electrode contacts with the second top surface of the second nitride-based semiconductor layer, and
wherein the concave or convex portion faces to the first electrode with respect to a thickness direction of the second nitride-based semiconductor layer.

10. A semiconductor light emitting device, comprising:
a plurality of first conductive semiconductor layers;
a plurality of concave or convex lens portions disposed between the plurality of first conductive semiconductor layers;
an active layer on the plurality of first conductive semiconductor layers; and
at least one conductive semiconductor layer on the active layer,
wherein the plurality of first conductive semiconductor layers comprises:
a second nitride-based semiconductor layer under the active layer, and
a first nitride-based semiconductor layer comprising the plurality of concave or convex lens portions under the second nitride-based semiconductor layer,
wherein the first nitride-based semiconductor layer has a refractive index less than that of the second nitride-based semiconductor layer, and
wherein an amount of aluminum (Al) material contained in the first nitride-based semiconductor layer is greater than an amount of aluminum (Al) material contained in the second nitride-based semiconductor layer.

11. The semiconductor light emitting device according to claim 10, further comprising:
a first electrode under the plurality of first conductive semiconductor layers;
a reflective electrode layer on the at least one conductive semiconductor layer; and
a conductive supporting member on the reflective electrode layer,
wherein the at least one conductive semiconductor layer is a p-type semiconductor layer.

12. The semiconductor light emitting device according to claim 10,
wherein a top surface of the first nitride-based semiconductor layer is disposed on a same plane with a top surface of the plurality of concave or convex lens portions, and
wherein the plurality concave or convex lens portions comprises at least one of $SiO_2$, ITO, $Al_2O_3$, and Si.

13. The semiconductor light emitting device according to claim 10, wherein each of the plurality of concave or convex lens portions has a height of 0.01-50 μm and a width of 0.01-1000 μm.

14. The semiconductor light emitting device according to claim 10,
wherein the first nitride-based semiconductor layer is thicker than the second nitride-based semiconductor layer.

15. The semiconductor light emitting device according to claim 10, further comprising:
a substrate under the plurality of first conductive semiconductor layers; and
a plurality of convex lens portions protrude from a top surface of the substrate.

16. The semiconductor light emitting device according to claim 8, further comprising a first electrode on the first conductive semiconductor layer,
wherein the second nitride-based semiconductor layer includes a stepped structure having a second top surface stepped lower than a first top surface thereof,
wherein the first electrode contacts with the second top surface of the second nitride-based semiconductor layer, and
wherein the concave or convex portion faces to the first electrode with respect to a thickness direction of the second nitride-based semiconductor layer.

17. The semiconductor light emitting device according to claim 9,
wherein the concave or convex portion comprises at least one of $SiO_2$, ITO, $Al_2O_3$, and Si, and
wherein the first nitride-based semiconductor layer is a AlGaN layer or GaN layer and the second nitride-based semiconductor layer is a GaN layer or InGaN layer.

18. The semiconductor light emitting device according to claim 12, further comprising:
a first electrode directly contacted with a lower surface of the first nitride-based semiconductor layer;
a reflective electrode layer on the at least one conductive semiconductor layer; and
a conductive supporting member on the reflective electrode layer.

* * * * *